(12) United States Patent
Tavares et al.

(10) Patent No.: US 6,420,927 B1
(45) Date of Patent: Jul. 16, 2002

(54) FILTER AND HOLD CIRCUIT UTILIZING A CHARGE/DISCHARGE CURRENT

(75) Inventors: Vitor Manual Grade Tavares; Jose C. Principe; John G. Harris, all of Gainesville, FL (US); Pedro Guedes de Oliveira, Porto (PT)

(73) Assignee: University of Florida, Gainesville, FL (US)

( * ) Notice: Subject to any disclaimer, the term of this patent is extended or adjusted under 35 U.S.C. 154(b) by 0 days.

(21) Appl. No.: 09/633,335

(22) Filed: Aug. 7, 2000

Related U.S. Application Data
(60) Provisional application No. 60/147,320, filed on Aug. 5, 1999.

(51) Int. Cl.[7] .............................................. H03K 5/00
(52) U.S. Cl. ......................... 327/554; 327/94; 327/557; 327/558; 327/559
(58) Field of Search ........................ 327/94, 553, 552, 327/554, 557, 558, 559

(56) References Cited

U.S. PATENT DOCUMENTS

| | | | | |
|---|---|---|---|---|
| 4,886,986 A | * | 12/1989 | Watanabe | 327/94 |
| 5,268,576 A | * | 12/1993 | Dudley | 250/332 |
| 5,998,977 A | * | 12/1999 | Hsu et al. | 323/272 |

OTHER PUBLICATIONS

R. W. Brodersen, P. Gray, and D. Hodges "MOS Switched–Capacitor Filters" *Proc. IEEE*, vol. 67, pp. 61–75, Jan. 1979.

J. Hughes, N. Baird, and I. Macbeth "Switched currents—A new technique for analog sampled data signal processing", *International Symposium on Circuits and Systems*, pp. 1584–1587, 1989.

R. Gregorian, G. C. Temes "Analog MOS Integrated Circuits for signal processing" John Wiley & Sons inc, 1986.

V. Tavares, J. Principe, and G. Lynn "Discrete network implementation of Freeman's model of the olfactory system" *IEEE WCCI–IJCNN*, pp. 1488–1493, 1998.

C. Mead "Analog VLSI neural systems", Addison–Wesley, 1989.

W. Freeman "Mass action in the nervous system", Academic Press, 1975.

J. Principe, and B. de Vries "The gamma filter a new class of adaptive IIR filters with restricted feedback", IEEE Transactions on Signal Processing, 41(2), pp. 649–656, 1993.

* cited by examiner

*Primary Examiner*—Dinh T. Le
(74) *Attorney, Agent, or Firm*—Saliwanchik, Lloyd & Saliwanchik

(57) ABSTRACT

The subject invention pertains to a method and circuit design particularly useful for long time constant RC active or passive circuits in either continuous or discrete time domains. The subject invention also relates to a method and circuit design useful for long time constant RL active or passive circuits in either continuous or discrete time domains. The subject invention can find advantage in the mixed-signal, electronic circuit component market. The subject invention widens the application and the price/performance ratio of VLSI analog electronic circuits, and can be easily included in conventional circuit designs.

36 Claims, 11 Drawing Sheets

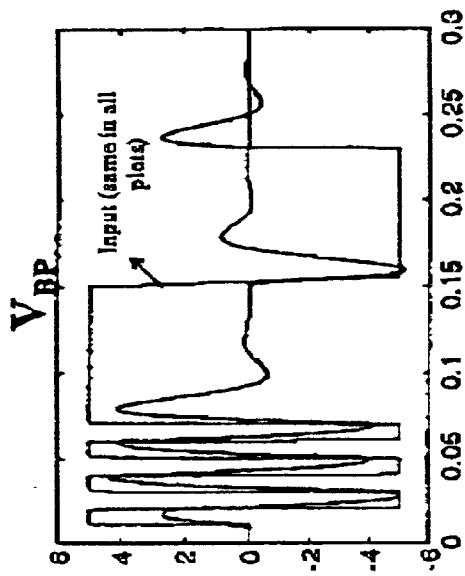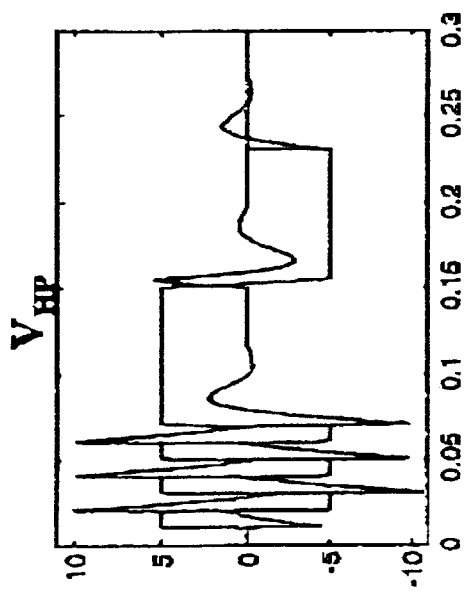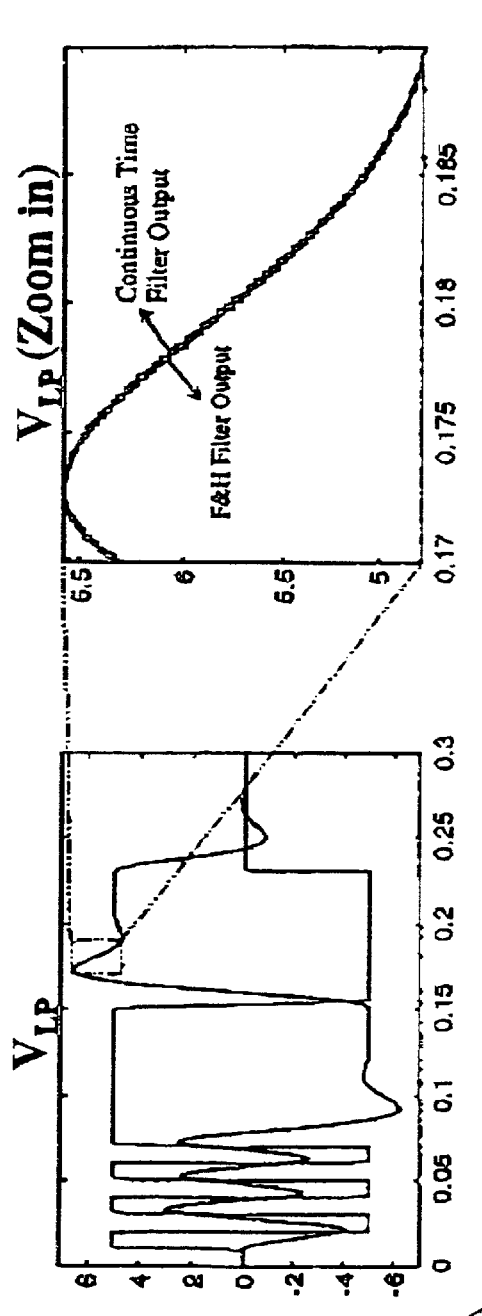
FIG. 4A
FIG. 4B
FIG. 4C

FILTER AND HOLD CIRCUIT UTILIZING A CHARGE/DISCHARGE CURRENT

CROSS-REFERENCE TO RELATED APPLICATION

This application claims the benefit of U.S. Provisional Application No. 60/147,320, filed Aug. 5, 1999.

BACKGROUND OF THE INVENTION

A severe problem in VLSI analog electronic circuit design is that large time constants require high values of R (the resistors) and/or C (the capacitors), both of which occupy large areas in the chip. Prior attempts to address this problem have not yet found a good compromise between the need for large time constants and the need for miniaturization. The most relevant is the switched capacitor technology, which provides an equivalent resistor with a clock and a capacitor.

The mixed-signal, electronic circuit component market is the interface between the analog and the digital-worlds of today's instrumentation. Although analog signal processing has lost market share with the advent of the digital computer, there still exists a need to interface instruments and sensors to the real world. This interface is the mixed-signal domain. One of the goals of the mixed-signal circuits is to operate within the constraints being imposed by the digital electric circuits.

Large-scale integration in mixed-signal circuits is not always possible due to the physical limitations of the technology and the size of the dies. Time constants of milliseconds require capacitor or resistor sizes that do not fit the size of VLSI circuits. Since circuitry to meet these time constant requirements take too much area, one of the components is often placed external to the chip. The approach needs chip-pins to the exterior, and carries with it extra components and complexity to the board design. Furthermore, those extra pins mean bigger and more expensive packaging.

In most analog VLSI circuits, the capacitors that can be built are rather small (in the order of tens of pF). This can create a problem whenever large time constants (in the milliseconds or longer) are required. Man-made or naturally occurring signals are very often slowly varying, and require filters with low cut-off frequencies or, equivalently, with large time constants. For instance, the A/C power oscillates 60 times a second. We have running in our University of Florida laboratory a VLSI Filter and Hold (F&H) circuit implemented in subthreshold mode, using very low bias currents, with a cutoff lower the A/C power line frequency.

BRIEF OF SUMMARY OF THE INVENTION

The subject invention pertains to a method and circuit design particularly useful for long time constant RC active or passive filters in either continuous or discrete time domains. The subject invention can find advantage in the mixed-signal, electronic circuit component market. The subject invention widens the application and the price/performance ratio of VLSI analog electronic circuits, and can be easily included in conventional circuit designs.

The subject invention can address the need for large time constants by, for example, multiplying the capacitor value by the inverse of the duty-cycle. In this manner time constants on the order of few seconds can be achieved with small capacitors. This provides a simpler solution than in the past. In addition, a broad set of continuous time active filtering topologies can be used to implement a F&H with minor changes. Very low power systems can also be implemented with the subject technology. Most of the sampled systems have to comply with speed requirements, i.e., the capacitors have to be charged as fast as possible, often requiring large currents. In the subject Filter and Hold (F&H) system, the integration operation of a capacitor is an intrinsic part of the system since the switching of capacitor current can provide the scaling ability.

The subject Filter and Hold (F&H) technology can share one or more of the analog active filter characteristics. In general, analog, continuous-time filter implementations render simpler and smaller circuits than other designs based on sampling (such as switch capacitor and switch current). In this respect the subject invention provides the following benefits: area efficiency;

auxiliary circuits are simple;

time constants can be trimmed both by controlling the equivalent resistor value as well as the value of k, the product of the duration of the sampling pulse and its frequency of occurrence;

low power implementations are possible; and very long time constants are achievable.

The subject invention can avoid many of the problems associated with large-scale integration in mixed-signal circuits. With the subject invention, full VLSI integration is possible for a broader class of low frequency signals, for example, 60 Hz (50 Hz in Europe) notch filters. These filters are required for many applications ranging from instrumentation, sensing of biological signals, telecommunications circuits, the exploding micro electrical mechanical (MEM) devices, and the emerging intelligent sensor markets. The subject invention can also be applied to machine learning computation in order to, for example, create associate memories and/or store information.

The subject invention can enable miniaturization of mixed-signal circuits to a level not possible before. This can decrease price and power consumption, improve reliability, shape factors, and enable new functionality. Intelligent sensors attempt to put together the sensor and the signal processing in the same dye. Intelligent sensors can require front-end signal processing with strict constraints of low power and small size, which can be implemented with the subject invention.

Advantageously, the method and apparatus of the subject invention can be compatible with different integration techniques such as Bipolar, BICMOS, or CMOS as long as continuous-time filtering design is possible. A specific application of the subject Filter and Hold (F&H) technology is circuits which accept analog signals of low frequency content (the so-called mixed-signal circuits), particularly in portable systems with low power requirements such as biomedical instrumentation, 60 Hz (50 Hz) notch filters, audio, and so on. The subject invention can also be used in high frequency applications.

BRIEF DESCRIPTION OF THE DRAWINGS

FIGS. 4A, 4B, and 4C show vector filter waveforms with sample and hold input/output, with continuous time and F&H filter plots superimposed (LP—Low-Pass, BP—Band-Pass, HP—High-Pass).

DETAILED DISCLOSURE OF THE INVENTION

The subject invention pertains to a method and circuit design particularly useful for long time constant RC active or passive filters in either continuous or discrete time domains. The subject invention also relates to a method and circuit design for use in long time constant RL active or passive filters in either continuous or discrete time domains. The subject invention widens the application and the price/performance ratio of VLSI analog electronic circuits, and can be easily included in conventional circuit designs. The subject invention can be applied to many methods and apparatus for signal processing, including, but not limited to, signal filtering and signal integration.

Figure 1A:
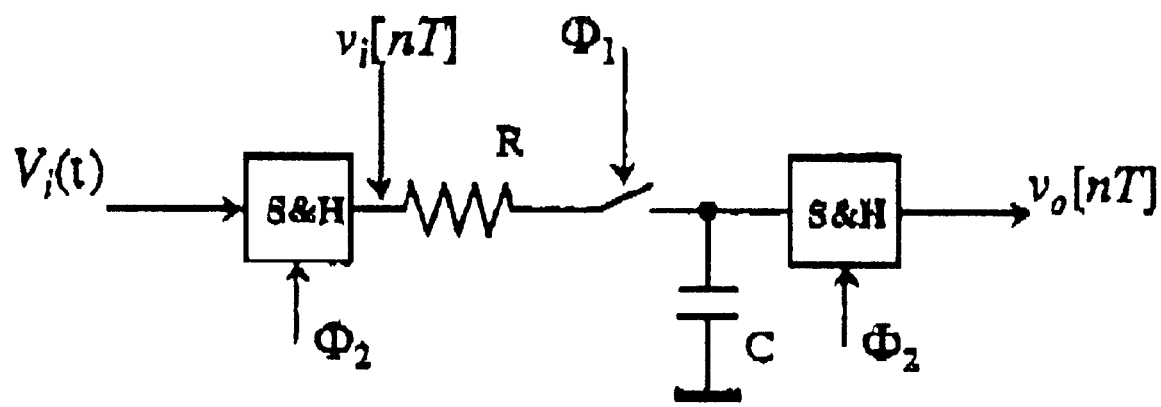
FIGS. 1A and 1B illustrate a discrete time low-pass filter.
Figure 1B:
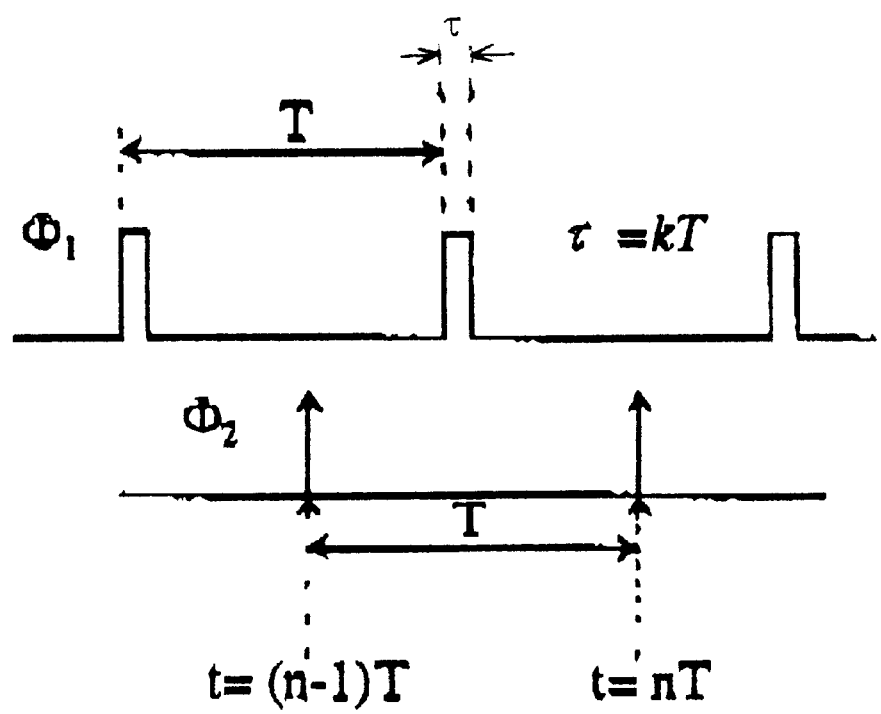

The subject design methodology can increase the value of the effective circuit time constant by interrupting the capacitor's charge/discharge current for a controlled and periodically repeated amount of time. Since this operation results in a sampled data system, it can be assumed (or enforced with an anti-aliasing filter) that the input signal is band-limited. In addition, the period of the switched charge/discharge can be related to the maximum signal frequency, according to the Nyquist theorem. Referring to FIGS. 1A and 1B, a $1^{st}$ order low-pass filter in the discrete time domain is shown.

Figure 11:
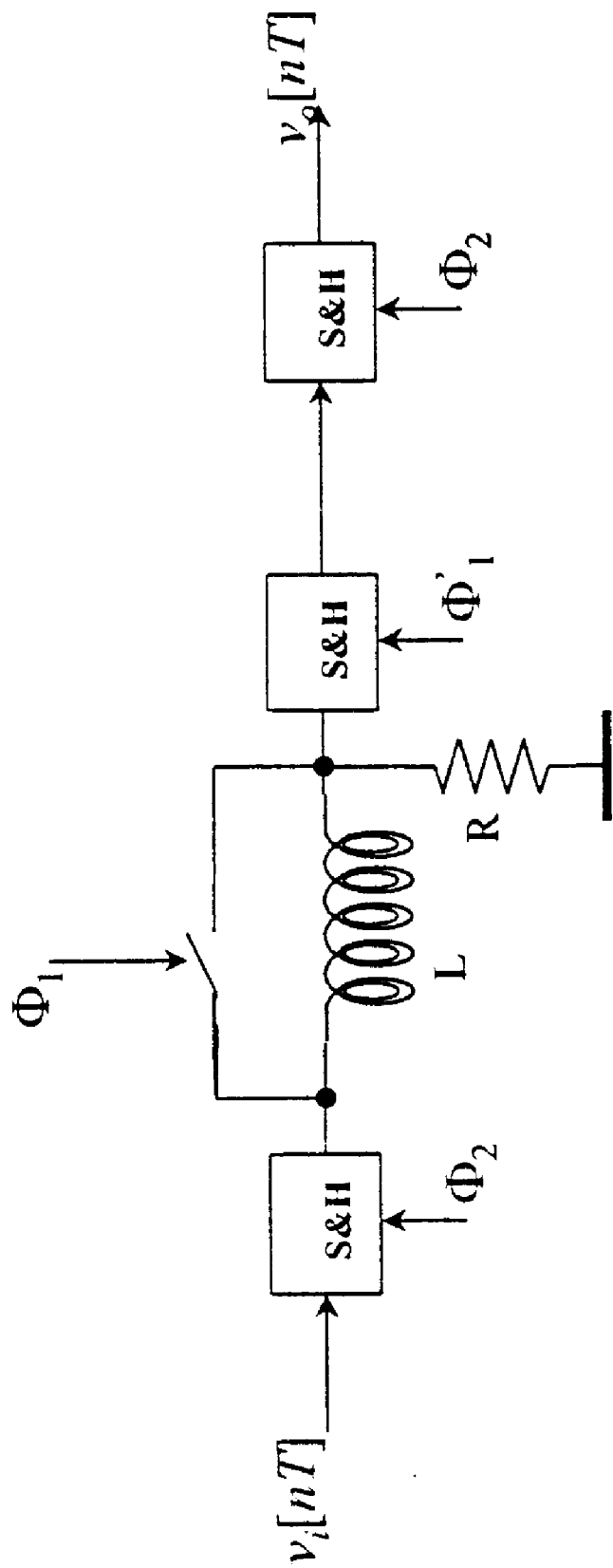
FIG. 11 illustrates a circuit utilizing an inductor in accordance with the subject invention.

With respect to circuits comprising one or more inductors, the subject design can increase the value of the effective circuit time constant by shorting the inductor's current for a controlled and periodically repeated amount of time. Again, the period of the shorted current can be related to the maximum signal frequency, according to the Nyquist theorem. Referring to FIG. 11, a circuit utilizing a periodically shorted inductor current is shown.

The method and apparatus of the subject invention can provide scaling ability which allows slow-time constants in miniaturized (VLSI) implementations, very low power circuitry, implementation of better price/performance ratio of mixed-signal circuits due to miniaturization, and simple design which does not impose as many constraints as switched-capacitor circuits. Specific embodiments of the subject Filter and Hold (F&H) filters are inherently discrete-time, such that sample-and-hold is not required for the input. From simulations it appears that as long as the input is band limited and the output is smoothed with a low-pass filter, the F&H works seemingly as if it were a continues time system with scaled time constants. This is of major importance since sampling systems typically assume already staircase signals, which implies a sample-and-hold circuit. Hence, there can be less complexity associated with F&H circuits.

In the example shown in FIGS. 1A and 1B, assume the input is the result of a sample-and-hold operation of an analog signal, and the current to the capacitor is only provided during a fraction k of the sampling period. The current provided to the capacitor can be from one circuit branch or from a plurality of circuit branches, for example, summed at the capacitor. Accordingly, the total voltage change in the capacitor at the end of the period T is the same as the one caused by a 1/k times larger time constant filter during an integration time corresponding to the whole period T.

This can be shown mathematically.

Since $v_1[nT]$ is constant when $\Phi_1$ is activated, finding the difference equation corresponds to the calculation of the filter step response for an interval of time of $\tau$ seconds with initial condition at the capacitor of $v_o[(n-1)T]$ as in (1).

$$v_o[nT]=V_i[(n-1)T]+\{V_o[(n-1)T]-V_i[(n-1)T]\}e^{-\tau/RC} \quad (1)$$

The Z transform corresponding to (1) is given in (2), with $\tau=kT$.

$$H(z) = \frac{V_o(z)}{V_i(z)} = \frac{(1-e^{-kT/RC}) \cdot z^{-1}}{1-e^{-kT/RC} \cdot z^{-1}} \quad (2)$$

Equation 2 shows that the pole location is effectively repositioned according to the duty-cycle k. Furthermore, the continuous time constant 1/RC is scaled down by a factor of k times. This means that very low frequency poles can be obtained from faster and more easily realizable components. This can be achieved without changing the physical parameters R or C.

The method and apparatus of the subject invention can also be applied to high-pass circuits.

Figure 2B:
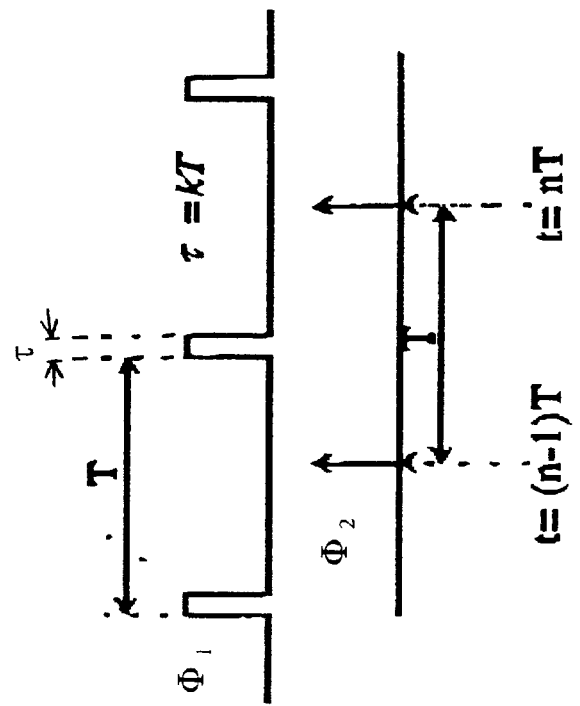
FIGS. 2A and 2B illustrate a discrete high-pass filter circuit.
Figure 2A:
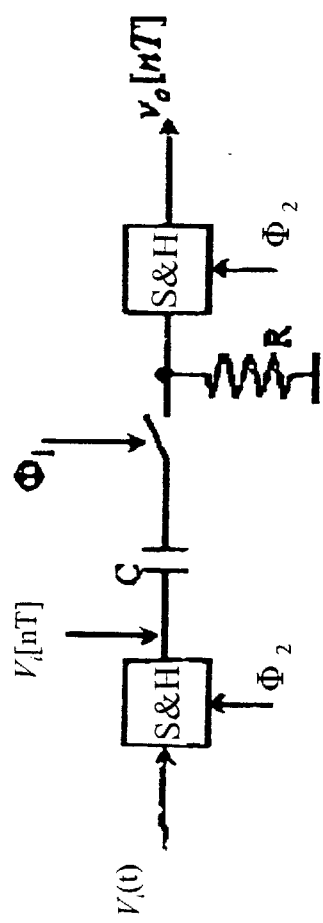

The same principles and assumptions made with respect to the discrete-time low-pass filter of FIGS. 1A and 1B result in the following set of equations for the high-pass filter of FIGS. 2A and 2B.

$$v_o[nT]=\{V_i[(n-1)T]+(V_o[(n-1)T]V_i[(n-2)T])\}e^{-\tau/RC} \quad (3)$$

$$H(z) = \frac{V_o(z)}{V_i(z)} = \frac{e^{-kT/RC} \cdot (1-z^{-1}) \cdot z^{-1}}{1-e^{-kT/RC} \cdot z^{-1}} \quad (4)$$

Figure 3:
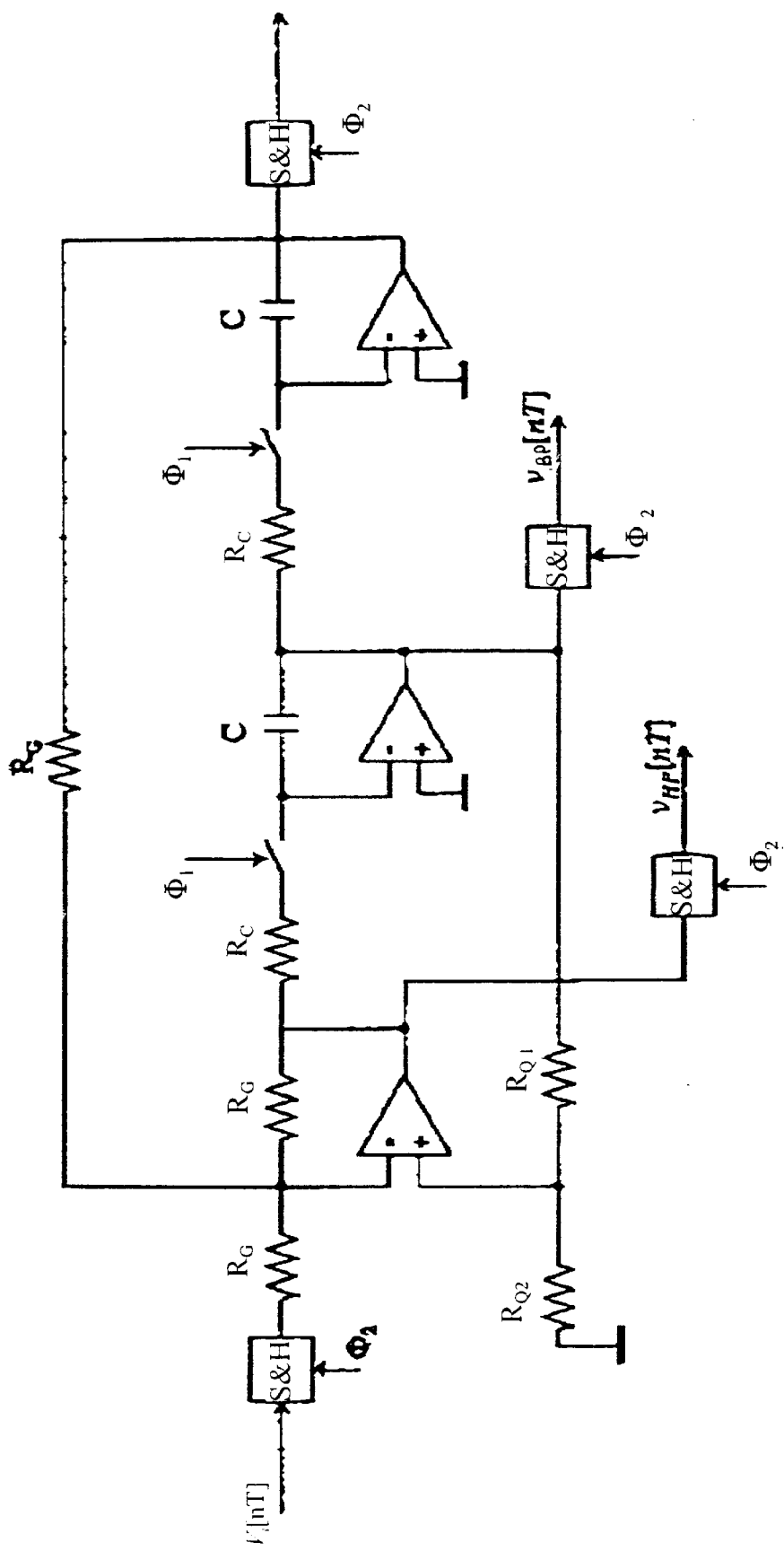
FIG. 3 illustrates a discrete time F&H Vector filter circuit (LP—Low-Pass, BP—Band-Pass, HP—High-Pass).

Accordingly, the method and apparatus of the subject invention relate to a methodology of freezing the integration time with respect to a capacitor. This technology is also applicable, and can be shown to work, with more complex higher order filters. Referring to FIG. 3, a generalized vector filter is shown, which can incorporate the advantages of the subject invention.

Building a Filter and Hold (F&H) can be relatively simple utilizing the subject invention. Select a convenient continuous time circuit topology and switch a current that is to be integrated by a capacitor. The resulting capacitor can be given by $$C = \frac{1}{k} \cdot C$$

The transfer function is changed accordingly while the rest of the parameters can be unchanged. Alternatively, the other parameters of the filter that contribute to the current, like the resistor value R in FIG. 1, can be changed by k without a change in C. In general, more than one parameter can be changed. In a specific embodiment, both R and C can change by $k^{1/2}$.

Simulations were carried out with a set-up given by Table I. The corresponding waveforms are shown in FIGS. 4A, 4B and 4C.

TABLE I

Example Set-Up

| Components | Continuous Time Vector Filter | Filter and Hold (F&H) Vector Filter |
|---|---|---|
| $f_g$ (sampling Freq.) | — | 4 kHz |
| $k = . . f_g$ | — | 1/100 |
| $f_0$ | 30 Hz | <=> 30 Hz |
| $R_c$ | 2 M | 2 M |
| C | 2.7nF | 27pF |
| Q | 2 | <=> 2 |
| $R_{Q1}$ | 10 k | 10 k |
| $R_{Q2}$ | 5 k | 5 k |
| $R_G$ | 100 k | 100 k |

The subject methodology has been shown to work with continuous time signals (given the necessary Nyquist bandlimited condition) without a previous sample and hold. In this case, the circuit can be followed by a smoothing filter, common in discrete time systems (see FIG. 5). An original analogue system defined by (5) can be changed into a slower dynamical system defined by (6) due to the F&H type of integration.

$$H_c(W) = C \cdot [jW \cdot I - A]^{-1} \cdot B + D \quad (5)$$

$$H(W) = C \cdot [jW \cdot I - k \cdot A]^{-1} \cdot k \cdot B + D \quad (6)$$

Figure 5:
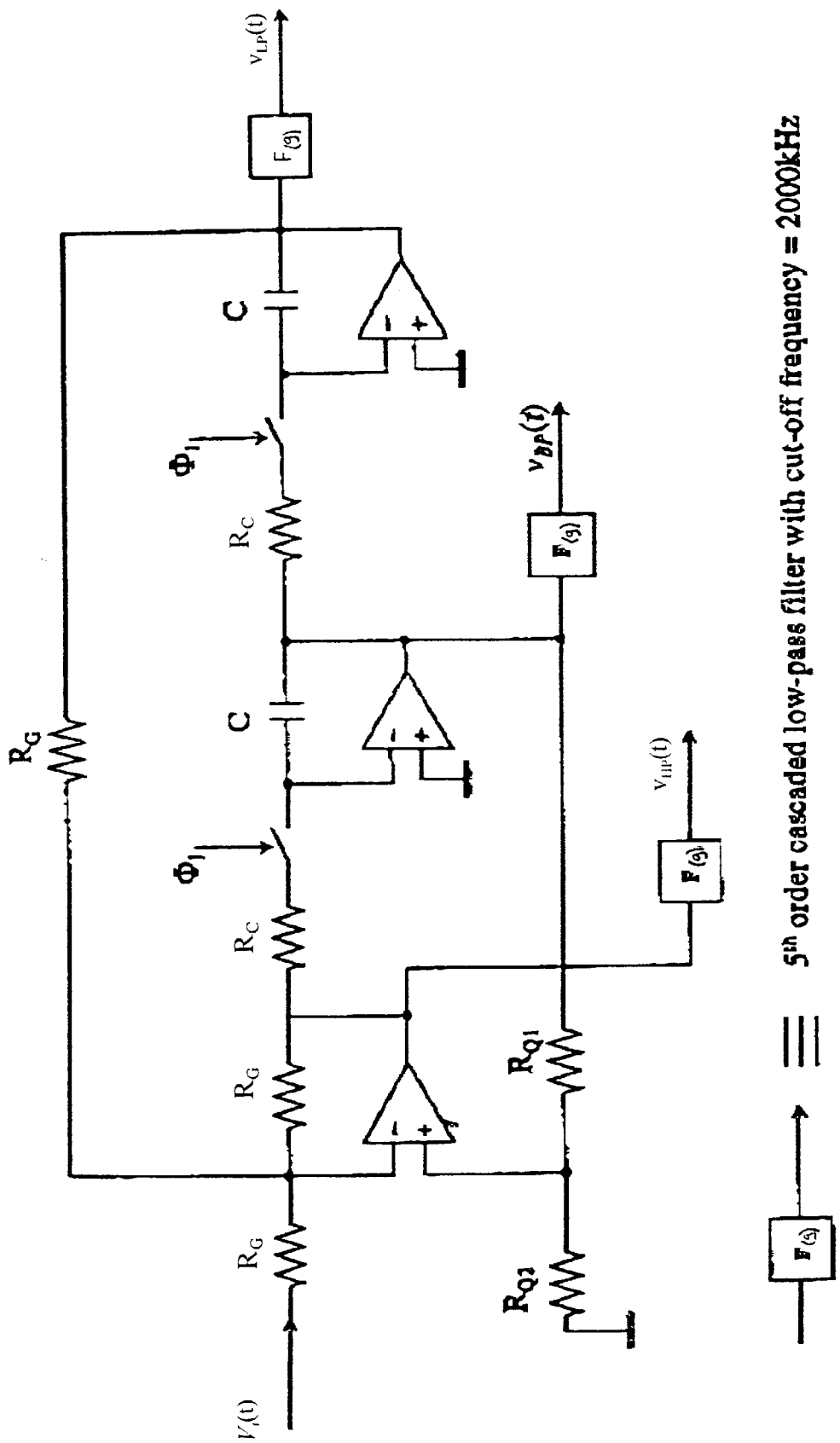
FIG. 5 illustrates a continuous time F&H Vector filter circuits (LP—Low-Pass, BP—Band-Pass, HP—High-Pass).
Figure 6A:
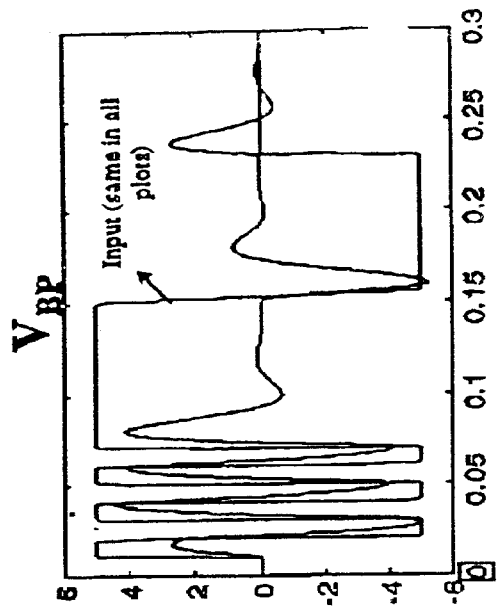
FIGS. 6A, 6B, and 6C show vector filter waveforms with smoothing filters and no sample and hold, with continuous time and F&H filter plots superimposed (LP—Low-Pass, BP—Band-Pass, HP—High-Pass).
Figure 6B:
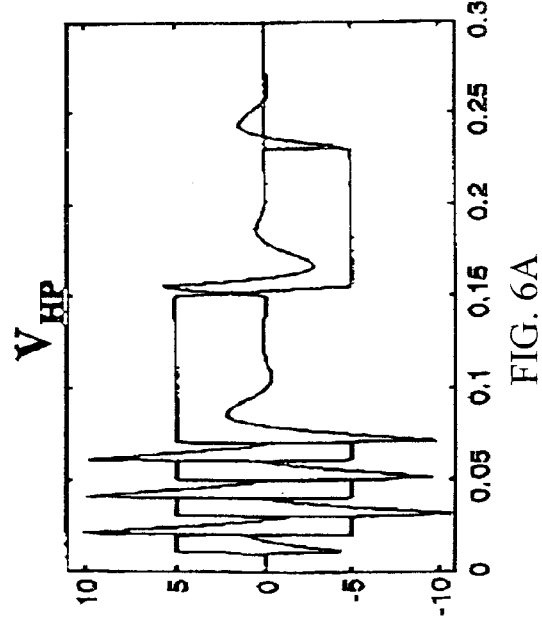
Figure 6C:
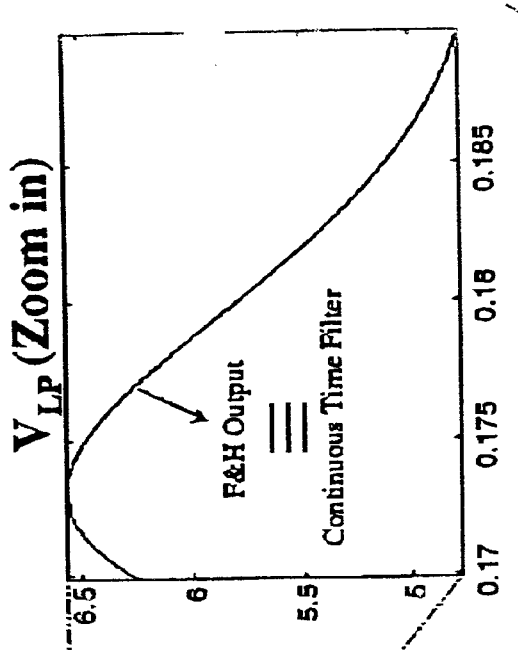
Figure 6C:
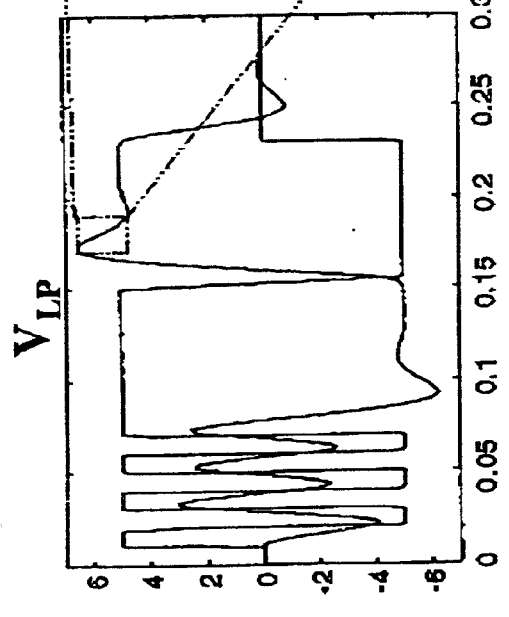

Simulations were performed for the circuit shown in FIG. 5. The smoothing filter is also represented and cuts at $f_g/2$. The result is confronted with a similar circuit of FIG. 5, but now the system has no switching and the capacitors were made 100 (k=1/100) bigger (Table I). The same smoothing filter is put at the output of this filter such that phase and attenuation affect both in the same way. As shown in FIG. 6, a F&H filter with continuous time input and smoothing output filter has a response that coincides with a continuous time filter of the same topology but with 1/k times bigger capacitors.

The subject invention relates to the design of filters with long time constants in the discrete time domain. The F&H (Filter and Hold) methodology of the subject invention can halt the state of a continuous time filter every T seconds resulting in a filter implementation with time constants that can be controlled in at least three ways: by adjusting the sampling period T, by adjusting the duty-cycle $k=\tau/T$, and/or by adjusting the time constant of the continuous time filter prototype. In a specific embodiment, the subject filter can be constructed using a typical Gm-C technique with very low-power consumption.

Figure 7:
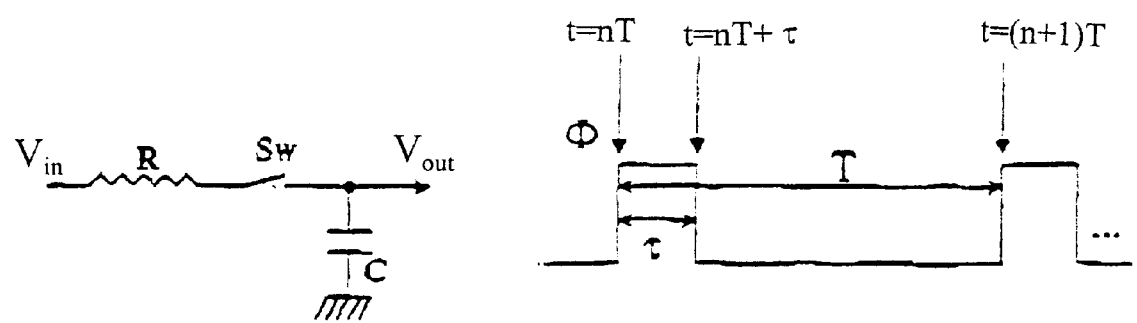
FIG. 7 illustrates a one pole continuous time filter in accordance with the subject invention.

The subject F&H filter design can take advantage of sampling the states of a continuous time filter. Consider a one pole system as in FIG. 7. The $S_w$ switch is controlled by the clock $\Phi$ with period T and closure duration $\tau$ creating a duty-cycle of $k=\tau/T$. Assume that $V_{in}(nT)$ is constant in the interval $(nT-\Delta) \leq t \leq (nT+\tau+\Delta)$ with $\Delta$ a vanishing small number. Then $V_o(nT+\tau)$ is the step response of the RC network after $\tau$ seconds given by (7).

$$V_o(nT + \tau) \equiv V_o([n+1]T) = V_{in}(nT) + [V_o(nT) - V_{in}(nT)] \cdot e^{\alpha kT} \quad (7)$$

$$\alpha = 1/RC \quad \tau = k \cdot T$$

$V_o(nT+\tau) \equiv V_o([n+1])T \equiv V_o[n+1]$ because the switch opens at $t=nT+\tau$ and so that voltage is held in the capacitor until the next update. The difference equation (7) yields a transfer function H(z) defined in (8).

$$H(z) = [(1-e^{-\alpha kT}) \cdot z^{-1}]/[1-e^{-\alpha kT} \cdot z^{-1}] \quad (8)$$

Since k<1 the time constant can be made slower by the factor 'k', effectively implementing a much slower cut-off low-pass filter.

Consider now the second-order differential equation defined by (9) with time constants at a=2200/s(350 Hz) and b=7200/s (1146 Hz). Equation (9) is part of a non-linear dynamical system that can model the mammalian olfactory system ('a' and 'b' are real).

$$(1/a \cdot b)(\partial^2 x/\partial t + (a+b)\partial x/\partial t + a \cdot b \cdot x) = f(t) \quad (9)$$

Figure 8:
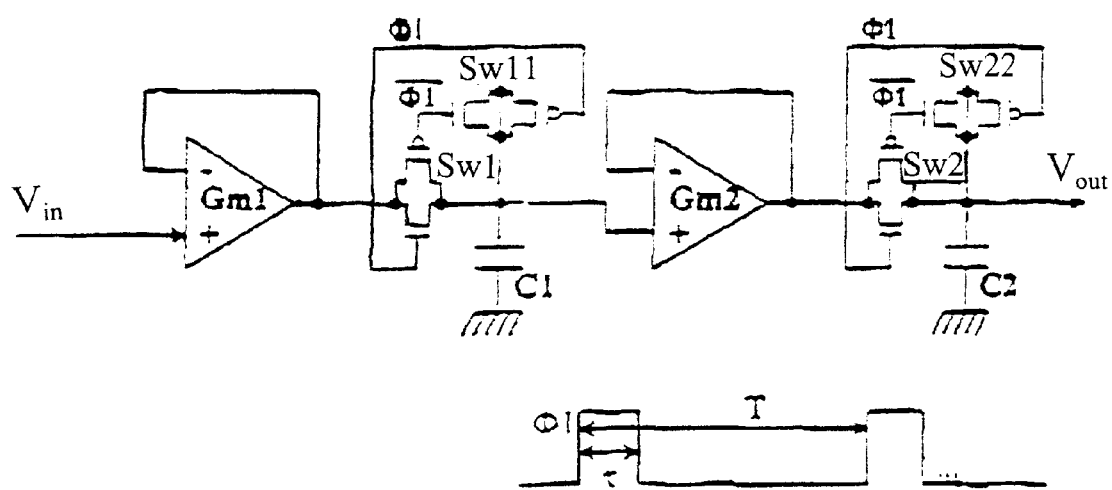
FIG. 8 illustrates a cascade of two low-pass discrete time filters in accordance with the subject invention.

This differential equation can be approximated by a cascade of two low-pass discrete time filters such as the F&H circuit shown in FIG. 8. The opamp symbol can represent a transconductance amplifier, such as a simple differential pair in a Gm-C filter. The constants 'a' and 'b' are defined by:

$$a = a_1 \cdot k = (Gm1/C1) \cdot k \quad b = b_1 \cdot k = (Gm2/C2) \cdot k \quad (10)$$

Figure 9:
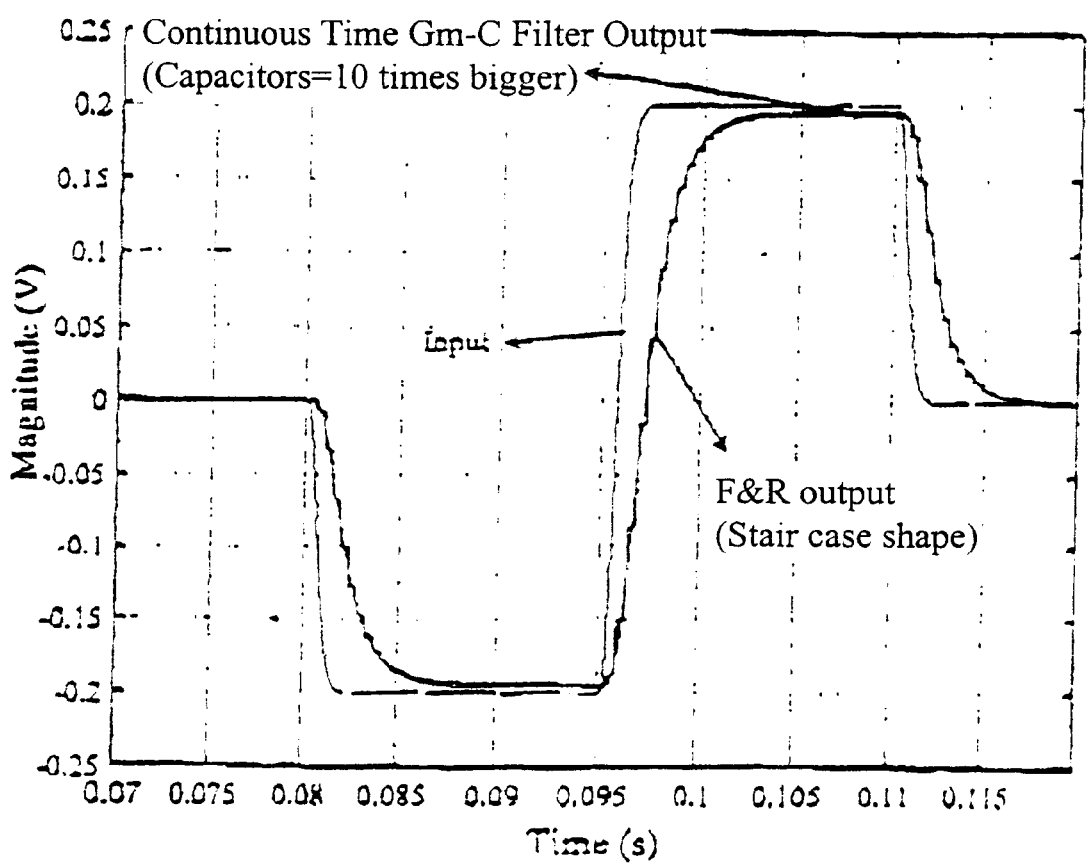
FIG. 9 shows a simulation result for a F&H second order filter and a corresponding continuous time filter with capacitors 10 times larger that the capacitors utilized for the F&H filter.

Simulations can be run utilizing MOSIS 1.2μ technology. For purposes of such a simulation, the duty-cycle can be made to be k=0.1 which corresponds to time constants of $a_1$=22 k/s (3.5 kHz) and $b_1$=72 k/s (11.46 kHz). The operational transconductance amplifier (OTA) can have a fixed 10 nA bias current with capacitors of C1=1 pF. and C2=3.3 pF. FIG. 9 shows a simulation result for a F&H second order filter and a corresponding continuous time filter with capacitors 10 times larger than the capacitors utilized for the F&H filter.

Figure 10:
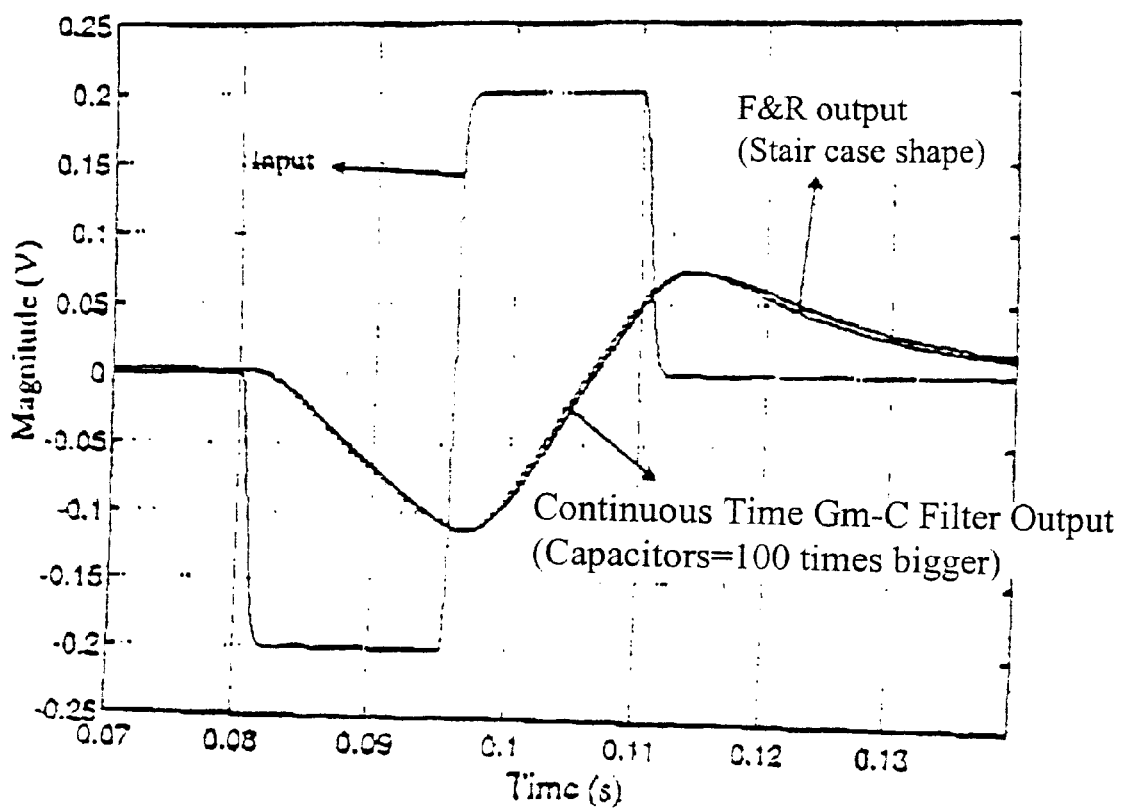
FIG. 10 shows the result after, trimming k (final k=0.0093), of utilizing the filter of FIG. 8 to implement the filter defined by equation (9), with a=220/s(35 Hz) and b=720/s(114.6 Hz).

The filter of FIG. 8 can be utilized to implement the filter defined in (9) with a=220/s (35 Hz) and b=720/s (114.6 Hz). The duty-cycle can be changed to k=0.01. The time constants can then be scaled up by a factor of 100. At this low duty-cycle the clock-feedthrough acts as an injected error to the time constant. Trimming the time constants with the duty-cycle compensates for this effect to a large extent. FIG. 10 shows the result after trimming k (final k=0.0093).

The power consumption of the subject discrete time low-pass filter can be made extremely low. In the $2^{nd}$ order filter example shown, the power consumption is roughly 100 nW. The subject filter can be fine tuned by adjusting the duty-cycle k, by adjusting the time period T, and/or by adjusting Gm. The time constants are scalable by the duty-cycle, which allows low frequency filters to be built from easily achievable time-constants for the target technology with no change in the sampling period.

Low-pass filters with large time constants are advantageous for biological systems modeling. The subject filters can be utilized to implement these models. The subject filters and method can also find application with respect to adaptive processing based on dispersive delay lines such as the Gamma filter. The subject F&H technique can be applied to, for example, highpass (HP) filters, low pass (LP) filters, band-pass (BP) filters, and band-rejection (BR) filters, and can be applied to a wide range of different active filter topologies of any order. The subject techniques can also be applied to non-sampled input signals, where, preferably, the output is passed through a smoothing filter (at π/T) and/or the input is band limited to π/T. The resulting filter is equivalent to a continuous time filter with time constants 1/k times longer.

Referring to FIG. 11, an embodiment of the subject invention for use with circuits utilizing one or more inductors is shown. As shown in FIG. 11, the voltage across the inductor is shorted with a switch operating at $\Phi_1$, as shown in FIG. 1B. The sample and hold operating at $\Phi'_1$, is preferably operated to cut delta seconds before $\Phi_1$ with delta $\rightarrow 0$. The circuit of FIG. 11 utilizes the input and output of voltages as most circuits to which this circuit will interact utilize voltages. However, a circuit having one or more inductors can utilize input and output currents. In this case, the S&H elements operating at $\Phi_2$ would, preferably, not be used. As would be apparent to one skilled in the art, having the benefit of the subject disclosure, other circuits utilizing one or more inductors can be fashioned in accordance with the subject invention. For example, highpass and vector filters similar to FIGS. 2A, 3, and 5, can be fashioned in accordance with the subject invention.

It should be understood that the examples and embodiments described herein are for illustrative purposes only and that various modifications or changes in light thereof will be suggested to persons skilled in the art and are to be included within the spirit and purview of this application and the scope of the appended claims.

What is claimed is:

1. A method of processing a signal, comprising:
   inputting a signal to a circuit, wherein said circuit comprises one or more capacitive elements and one or more resistive elements, wherein each capacitive element comprises a charge/discharge current, wherein said circuit has an effective RC time constant dependent on the magnitudes of the one or more capacitive elements and the one or more resistive elements; and
   interrupting at least one of said one or more capacitive element's change/discharge current in a periodic manner, wherein said at least one of said one or more capacitive element's charge/discharge current is uninterrupted for $\tau$ seconds within each period T and interrupted for T-$\tau$ seconds within each period T resulting in a duty-cycle of $k=\tau/T$ for said at least one of said one or more capacitive element's charge/discharge current, wherein the interruption of said at least one of said one or more capacitive element's charge/discharge current in a periodic manner modifies the circuit's effective RC time constant by 1/k.

2. The method according to claim 1, wherein interrupting said at least one of said one or more capacitive element's charge/discharge current in a periodic manner is accomplished with a switch operating with a period of T and a duration of closure of $\tau$ and a duty cycle of $k=\tau/T$.

3. The method according to claim 1, further comprising:
   inputting the signal to an anti-aliasing filter prior to inputting the signal to said circuit.

4. The method according to claim 1, wherein said signal is bandlimited.

5. The method according to claim 1, wherein said circuit is a lowpass filter.

6. The method according to claim 1, wherein said circuit is a highpass filter.

7. The method according to claim 1, wherein said circuit is a band rejection filter.

8. The method according to claim 1, wherein said circuit is in the discrete time domain.

9. The method according to claim 1, wherein said circuit is in the continuous time domain.

10. The method according to claim 1, wherein the period T is related to the signal by the relationship $f_{max} < \frac{1}{2}T$, where $f_{max}$ is a maximum signal frequency.

11. The method according to claim 1, further comprising:
    inputting an output signal from said circuit to a smoothing filter.

12. The method according to claim 1, further comprising:
    inputting the signal to a sample and hold element prior to inputting the signal to said circuit such that an output signal from the sample and hold element is input to said circuit.

13. The method according to claim 11, wherein said smoothing filter is a low-pass filter.

14. The method according to claim 1, wherein at least one of said one or more resistive elements comprises an active element.

15. The method according to claim 1, wherein said circuit has one or more poles and/or one or more zeroes, wherein the magnitude of said one or more poles and/or one or more zeroes is modified by 1/k.

16. The method according to claim 1, wherein said circuit is a band-pass filter.

17. A circuit, comprising:
    one or more capacitive elements which receive a corresponding one or more charge/discharge currents;
    one or more resistive elements, wherein the circuit has an effective RC time constant dependent on the magnitudes of the one or more capacitive elements and the one or more resistive elements; and
    a means for interrupting at least one of said one or more capacitive element's charge/discharge current in a periodic manner, wherein said means for interrupting at least one of said one or more capacitive element's charge/discharge current in a periodic manner leaves said at least one of said one or more capacitive element's charge/discharge current uninterrupted for $\tau$ seconds within each period T and interrupts said at least one of said one or more capacitive element's charge/discharge current for T-$\tau$ seconds within each period T resulting in a duty-cycle of $k=\tau/T$ for said at least one of said one or more capacitive element's charge/discharge current,
    wherein the interruption of the at least one of said one or more capacitive element's charge/discharge current in a periodic manner modifies the filter's RC time constant by 1/k.

18. The circuit according to claim 17,
    wherein said means for interrupting at least one of said one or more capacitive element's charge/discharge current in a periodic manner comprises a switch operating with a period of T and a duration of closure of $\tau$ and a duty cycle of $k=\tau/T$.

19. The circuit according to claim 17, further comprising:
    an anti-aliasing filter, wherein said signal is input to said anti-aliasing filter prior to inputting said signal to said circuit.

20. The circuit according to claim 17, wherein said signal is bandlimited.

21. The circuit according to claim 17, wherein said circuit is a lowpass filter.

22. The circuit according to claim 17, wherein said circuit is a highpass filter.

23. The circuit according to claim 17, wherein said circuit is a band rejection filter.

24. The circuit according to claim 17, wherein said circuit is in the discrete time domain.

25. The circuit according to claim 17, wherein said circuit is in the continuous time domain.

26. The circuit according to claim 17, wherein the period T is related to the signal by the relationship $f_{max} < \frac{1}{2}T$, where $f_{max}$ is maximum signal frequency.

27. The circuit according to claim 17, further comprising:
a smoothing filter, wherein an output signal from said circuit is input to the smoothing filter.

28. The circuit according to claim 27, wherein said smoothing filter is a low-pass filter.

29. The circuit according to claim 17, further comprising:
a sample and hold element, wherein the signal is inputted to the sample and hold element prior to being inputted to said circuit such that an output signal from the sample and hold element is input to said circuit.

30. The circuit according to claim 17, wherein at least one of said one or more resistive elements comprises an active element.

31. The method according to claim 17, wherein said circuit has one or more poles and/or one or more zeros, wherein the magnitude of said one or more poles and/or one or more zeros is modified by $1/k$.

32. The circuit according to claim 14, wherein said circuit is a band-pass filter.

33. A method of increasing the effective RC time constant of a circuit, comprising:
determining a factor $1/k$ by which an effective RC time constant of a circuit is to be increased, wherein the circuit comprises one or more capacitive elements and one or more resistive elements, wherein each capacitive element comprises a charge/discharge current, wherein the effective RC time constant of the circuit depends on the magnitudes of the one or more capacitive elements and the one or more resistive elements; and interrupting at least one of the one or more capacitive element's charge/discharge current in a periodic manner, wherein said at least one of said one or more capacitive element's charge/discharge current is uninterrupted for $\tau$ seconds within each period T and interrupted for T-$\tau$ seconds within each period T resulting in a duty-cycle of $k=\tau/T$ for said at least one of said one or more capacitive element's charge/discharge current, wherein the interruption of said at least one of said one or more capacitive element's charge/discharge current in a periodic manner modifies the circuit's effective RC time constant by $1/k$.

34. A method of increasing the effective RL time constant of circuit, comprising:
determining a factor $1/k$ by which the effective RL time constant of a circuit is to be increased, wherein the circuit comprises one or more inductive elements and one or more resistive elements, wherein each inductive element comprises a charge/discharge current, wherein the effective RL time constant of the circuit depends on the magnitudes of the one or more inductive elements and the one or more resistive elements; and shorting a voltage across at least one of the one or more inductive elements in a periodic manner, wherein the voltage across said at least one of said one or more inductive elements is not shorted for $\tau$ seconds within each period T and shorted for T-$\tau$ seconds within each period T resulting in a duty-cycle of $k=\tau/T$ for shorting the voltage across said at least one of said one or more inductive elements, wherein the shorting of the voltage across said at least one of said one or more inductive elements in a periodic manner modifies the circuit's effective RL time constant by $1/k$.

35. A method of processing a signal, comprising:
inputting a signal to a circuit, wherein the circuit comprises one or more inductive elements and one or more resistive elements, wherein each inductive element comprises a voltage across the inductive element, wherein said circuit has an effective RL time constant dependent on the magnitudes of the one or more inductive elements and the one or more resistive elements; and shorting a voltage across at least one of said one or more inductive elements in a periodic manner, wherein the voltage across said at least one of said one or more inductive elements is not shorted for $\tau$ seconds within each period T and shorted for T-$\tau$ seconds within each period T resulting in a duty-cycle of $k=\tau/T$ for shorting the voltage across said at least one of said one or more inductive elements, wherein the shorting of the voltage said at least one of said one or more inductive elements in a periodic manner modifies the circuit's effective RL time constant by $1/k$.

36. A circuit, comprising:
one or more inductive elements which have a corresponding one or more voltages across said one or more inductive elements;

one or more resistive elements, wherein the circuit has an effective RL time constant dependent on the magnitudes of the one or more inductive elements and the one or more resistive elements; and a means for shorting a voltage across at least one of said one or more inductive elements in a periodic manner, wherein said means for shorting the voltage across said at least one of said one or more inductive elements in a periodic manner leaves the voltage across said at least one of said one or more inductive elements not shorted for $\tau$ seconds within each period T and shorts the voltage across said at least one of said one or more inductive elements for T-$\tau$ seconds within each period T resulting in a duty-cycle of $k=\tau/T$ for shorting the voltage across said at least one of said one or more inductive elements, wherein the shorting of the voltage of the at least one of said one or more inductive elements in a periodic manner modifies the filter's RL time constant by $1/k$.

* * * * *

UNITED STATES PATENT AND TRADEMARK OFFICE
CERTIFICATE OF CORRECTION

PATENT NO. : 6,420,927 B1
DATED : July 16, 2002
INVENTOR(S) : Vitor Manuel Grade Tavares et al.

It is certified that error appears in the above-identified patent and that said Letters Patent is hereby corrected as shown below:

Column 2,
Line 14, "benefits: area efficiency;" should read -- benefits:
area efficiency; --.

Column 3,
Line 63, "continues" should read -- continuous --.

Column 4,
Line 17, "$\{V_0[(n-1)T]-V_{i[}(n-1)T]\}e^{-\tau/RC}$" should read -- $\{V_0[(n-1)T]-V_i[(n-1)T]\}e^{-\tau/RC}$ --.
Line 39, "$+(V_0[n-1]T]V_i[(n-2)T])\}e^{-\tau/RC}$" should read -- $+(V_0[(n-1)T]-V_i[n-2]T])\}e^{-\tau/RC}$ --.

Column 5,
Table I, line 11, "k = . .$f_g$" should read -- k = · ·$f_g$ --.
Line 66, "$V_0(nT+\tau) \equiv V_0([n+1])T \equiv V_0[n+1]$ because" should read -- $V_0(nT+\tau) \equiv V_0([n+1]T) \equiv V_0[n+1]$ because --.

Column 6,
Line 9, "a=2200/s(350 Hz)" should read -- a=2200/s (350 Hz) --.
Line 28, "C1=1 pF. and" should read -- C1=1pF and --.

Column 7,
Line 30, "change/discharge" should read -- charge/discharge --.
Line 62, "period T" should read -- period of T --.

Column 8,
Line 67, "is maximum" should read -- is a maximum --.

UNITED STATES PATENT AND TRADEMARK OFFICE
CERTIFICATE OF CORRECTION

PATENT NO.   : 6,420,927 B1
DATED        : July 16, 2002
INVENTOR(S)  : Vitor Manuel Grade Tavares et al.

It is certified that error appears in the above-identified patent and that said Letters Patent is hereby corrected as shown below:

<u>Column 9,</u>
Line 18, "claim 14" should read -- claim 17 --.

Signed and Sealed this

Seventeenth Day of June, 2003

JAMES E. ROGAN
*Director of the United States Patent and Trademark Office*